US008156840B2

(12) United States Patent
Tange

(10) Patent No.: US 8,156,840 B2
(45) Date of Patent: Apr. 17, 2012

(54) DRIVE APPARATUS OF SUBSTRATE CARRYING ROBOT INCLUDING COOLING CIRCULATION PATH

(75) Inventor: Makoto Tange, Tsu (JP)

(73) Assignee: Nabtesco Corporation, Tokyo (JP)

( * ) Notice: Subject to any disclaimer, the term of this patent is extended or adjusted under 35 U.S.C. 154(b) by 833 days.

(21) Appl. No.: 12/160,826

(22) PCT Filed: Jan. 12, 2007

(86) PCT No.: PCT/JP2007/050356
§ 371 (c)(1),
(2), (4) Date: Jul. 14, 2008

(87) PCT Pub. No.: WO2007/080986
PCT Pub. Date: Jul. 19, 2007

(65) Prior Publication Data
US 2009/0169343 A1  Jul. 2, 2009

(30) Foreign Application Priority Data

Jan. 13, 2006  (JP) .................. 2006-005616

(51) Int. Cl.
*B25J 17/00* (2006.01)
*B25J 17/02* (2006.01)
*B25J 18/00* (2006.01)
(52) U.S. Cl. .............. 74/490.03; 901/23; 74/490.01
(58) Field of Classification Search ........... 74/490.01, 74/490.03; 277/551, 562; 414/744.1; 901/23
See application file for complete search history.

(56) References Cited

U.S. PATENT DOCUMENTS

| 3,521,890 | A | * | 7/1970 | Holmes et al. ............. 277/551 |
| 5,687,605 | A | * | 11/1997 | Main .............................. 72/347 |
| 5,775,169 | A | * | 7/1998 | Solomon et al. ........... 74/490.01 |
| 5,794,487 | A | * | 8/1998 | Solomon et al. ........... 74/490.03 |
| 5,950,495 | A | * | 9/1999 | Ogawa et al. ............. 74/490.01 |
| 6,189,404 | B1 | * | 2/2001 | Hatake et al. ............. 74/490.03 |
| 2002/0047242 | A1 | | 4/2002 | Watanabe et al. |
| 2004/0169337 | A1 | | 9/2004 | Watanabe et al. |

FOREIGN PATENT DOCUMENTS

| JP | 06-285780 | 10/1994 |
| JP | 2761438 B2 | 6/1998 |
| JP | 2002228010 A | 8/2002 |
| JP | 4-253589 | 9/2002 |
| JP | 2004-084920 A | 3/2004 |
| WO | 9213669 | 8/1992 |

* cited by examiner

*Primary Examiner* — Justin Krause
(74) *Attorney, Agent, or Firm* — Panitch Schwarze Belisario & Nadel LLP

(57) ABSTRACT

There is provided a robot for carrying a substrate in which a contact type vacuum seal is cooled, the vacuum seal is prevented from exceeding a heat resistance temperature, and a trouble of leaking the atmosphere into a carrying chamber maintained in airtight is prevented from being brought about. In a drive apparatus of a robot for carrying a substrate containing a group of arms under a vacuum environment, a drive apparatus 1 for driving to rotate a group of arms 40 is arranged between to an atmospheric side and a vacuum side and is driven on the atmospheric side, the drive apparatus is provided with a contact type vacuum seal 30 between a stationary member and an output member, further, an oil seal 21 is provided on the atmospheric side of the contact type vacuum seal between the stationary member and the output member, a ring-like space 50 is formed by the contact type vacuum seal and the oil seal between the stationary member and the output member, and the stationary member is respectively provided with a supply port 51 of a cooling circulation path from the atmospheric side to the ring-like space and a discharge port 52 of the cooling circulation path from the ring-like space to the atmospheric side.

5 Claims, 3 Drawing Sheets

DRIVE APPARATUS OF SUBSTRATE CARRYING ROBOT INCLUDING COOLING CIRCULATION PATH

CROSS-REFERENCE TO RELATED APPLICATION

This application is a Section 371 of International Application No. PCT/JP2007/050356, filed Jan. 12, 2007, which was published in the Japanese language on Jul. 19, 2007, under International Publication No. WO 2007/080986 A1, and the disclosure of which is incorporated herein by reference.

TECHNICAL FIELD

The present invention relates to a substrate carrying robot, further in details, relates to a drive apparatus of a substrate carrying robot including a cooling circulation path in a fabrication apparatus of fabricating a processed object of a semiconductor wafer, a liquid crystal substrate or the like under a vacuum environment.

BACKGROUND ART

A carrying robot is used in a carrying chamber continuously provided to a processing chamber for carrying a processed object of a semiconductor wafer, a liquid crystal substrate or the like to respective processing chambers. A processed object of a semiconductor wafer, a liquid crystal substrate or the like abhors particles and needs to be processed finely. Therefore, a carrying robot is used under a vacuum environment. Further, maintenance of a carrying robot is carried out such that a particle is not generated in a vacuum environment.

According to a drive apparatus used in a carrying robot of a background art, a partition wall of a carrying chamber is provided with a bearing housing, a rotation input shaft is provided at the bearing housing rotatably through two bearings, the rotation input shaft is sealed in airtight by a magnetic fluid seal provided between the two bearings, thereby, a seal unit is constituted. Further, a lower end of the rotation input shaft is connected with a drive motor through a speed reducer (refer to, for example, Patent Reference 1).

Further, as other drive apparatus of a carrying robot, a vacuum drive apparatus having a function of hermetically sealing an interval between a motor stator and a motor rotor by a metal partition wall is widely and generally used (refer to, for example, Patent Reference 2).

However, according to the drive apparatus used under the vacuum environment of the background art as in Patent Reference 1, it is necessary to arrange a plurality of pieces of magnetic fluid seals in series in order to ensure an airtight function of a vacuum state, and therefore, a structure thereof is complicated, large-sized and expensive. Further, the magnetic fluid seal uses a special fluid, and therefore, maintenance by an end user cannot be carried out, a mist of a magnetic fluid is always discharged in vacuum, and therefore, a problem of contaminating a carrying chamber is posed.

Further, according to the vacuum drive apparatus having the hermitically sealing function by the metal partition wall between the motor stator and the motor rotor as in Patent Reference 2, although the airtight function is excellent, a bearing for rotatably supporting an output pivoting member operated with an external load needs to be arranged in vacuum. Therefore, an expensive bearing for vacuum is needed, an area thereof exposed to vacuum is increased, running cost for vacuuming is increased and the drive apparatus becomes expensive. Furthermore, when it is necessary to transmit a torque having a large output, a problem that a direct drive motor per se is large-sized more than the speed reducer is posed.

In order to resolve the problem of the background art disclosed in Patent Reference 1 or 2, Patent Reference 3 discloses to provide a gear apparatus for vacuum capable of being used as a drive portion of a fabrication apparatus for fabricating a processed object of a semiconductor wafer, a liquid crystal substrate or the like under a vacuum environment, which is small-sized and inexpensive and excellent in a maintenance performance.

According to the gear apparatus for vacuum of Patent Reference 3, the apparatus is characterized in that a contact type vacuum seal is provided between a stationary member and an output member of a gear apparatus for vacuum used under a vacuum environment. By constructing such a constitution, the drive apparatus used under the vacuum environment can be made to be small-sized. Further, the vacuum seal can be arranged by following a core of the stationary member and the output member of the gear apparatus for vacuum, and therefore, an operation of centering a seal unit of the background art and the speed reducer is dispensed with and a maintenance performance is promoted.

Patent Reference 1: JP-A-6-285780
Patent Reference 2: Japanese Patent Registration No. 2761438
Patent Reference 3: JP-A-2004-84920

DISCLOSURE OF THE INVENTION

Problems that the Invention is to Solve

The gear apparatus for vacuum disclosed in Patent Reference 3 is a drive apparatus of a robot for carrying a thin type substrate of a semiconductor wafer, a liquid crystal glass substrate or the like, the carrying robot is arranged at inside of a trans-chamber maintained in airtight for delivering the thin type substrate to a process chamber.

In this case, according to a process operated under a high temperature environment equal to or higher than 100° C. of CVD, PVD or the like, there is a case in which heat is transferred from the thin type substrate subjected to a high temperature processing to a robot arm, and a temperature of the contact type vacuum seal portion of the drive apparatus is elevated to exceed a heat resistance temperature of the vacuum seal. As a result, there poses a problem of bringing about a trouble of leaking the atmosphere to inside of the trans-chamber maintained in air tight.

It is an object of the invention to provide a drive apparatus of a substrate carrying robot in which a contact type vacuum seal portion of a drive apparatus of a substrate carrying robot is cooled, further, a robot arm is cooled as necessary, a vacuum seal is prevented from exceeding a heat resistance temperature, and a trouble of leaking the atmosphere into a trans-chamber maintained in airtight is prevented from being brought about.

Means for Solving the Problems

According to the invention, the above-described object is achieved by a drive apparatus of a robot for carrying a substrate in which a group of arms is accommodated under a vacuum environment, comprising:

a drive apparatus for driving to rotate the group of arms arranged between an atmospheric side and a vacuum side and driven on the atmospheric side such that the drive apparatus is driven on the atmospheric side;

wherein the drive apparatus includes:

a vacuum seal provided between a stationary member and an output member; and an oil seal provided on the atmospheric side of the vacuum seal between the stationary member and the output member, so that a ring-like space is formed by the vacuum seal and the oil seal between the stationary member and the output member;

wherein a cooling circulation path is formed such that the stationary member is provided with a supply port of the cooling circulation path from the atmospheric side to the ring-like space and a discharge port of the cooling circulation path from the ring-like space to the atmospheric side.

Further, according to the invention, the above-described object is achieved by a drive apparatus of a robot for carrying a substrate in which a group of arms is accommodated under a vacuum environment, comprising:

a drive apparatus for driving to rotate the group of arms arranged between an atmospheric side and a vacuum side and driven on the atmospheric side such that the drive apparatus is driven on the atmospheric side;

wherein the drive apparatus includes:

a vacuum seal provided between a stationary member and an output member; and an oil seal provided on the atmospheric side of the vacuum seal between the stationary member and the output member, so that a ring-like space is formed by the vacuum seal and the oil seal between the stationary member and the output member;

wherein another seal for dividing the ring-like space formed by the vacuum seal and the oil seal into two divided parts is provided between the stationary member and the output member, and a cooling circulation path is formed such that the stationary member is provided with a supply port of the cooling circulation path from the atmospheric side to the ring-like space on one of the divided parts and a discharge port of the cooling circulation path to the atmospheric side from the ring-like space on the other of the divided parts, and the output member is provided with a rotating supply path communicated with the ring-like space on the one of the divided parts and a rotating discharge path communicated with the ring-like space on the other of the divided parts, the rotating supply path and the rotating discharge path are opened to an arm member so as to cool the arm member.

In this case, it is preferable that the ring-like space on the one side is a ring-like space on the vacuum side, and the ring-like space on the other side is a ring-like space on the atmospheric side.

Further, it is preferable that the drive apparatus of a robot for carrying a substrate of the invention further includes a drive motor, an output transmission shaft contained on an inner peripheral side of a housing through the vacuum seal in a state of being brought into contact therewith, and a speed reducer for transmitting an output rotation of the drive motor to the output transmission shaft by reducing a speed thereof, and it is preferable that the speed reducer is an eccentric pivoting type speed reducer including an outer teeth gear member, a plurality of cam shafts inserted to holes of the outer teeth gear member, and an inner teeth gear member an inner periphery of which is brought in mesh with an outer periphery of the outer teeth gear member. Further, it is preferable to construct a constitution in which the stationary member of the invention is constituted by integrally coupling the housing and the inner teeth gear member, and the output member includes the output transmission shaft.

Further, an other oil seal can be provided to be opposed to the oil seal on the atmospheric side of the vacuum seal between the stationary member and the output member.

It is preferable that the vacuum seal of the invention is constituted by a contact type vacuum seal including a main lip brought into contact with an outer periphery of the output member, an elastic member for exerting a contact force to the main lip, and a fitting portion.

ADVANTAGE OF THE INVENTION

According to the invention, cooling of the vacuum seal of the drive apparatus of a robot for carrying a substrate, further, cooling of the arm member under the vacuum environment as necessary can efficiently be carried out. Thereby, there is provided the drive apparatus of a robot for carrying a substrate in which the vacuum seal is prevented from exceeding a heat resistance temperature, and a trouble of leaking the atmosphere into a carrying chamber maintained in airtight is prevented from being brought about.

Further, the arm member according to the invention includes parts reducing an accuracy of a locus of moving a robot, or reducing service life of respective parts (bearing, gear, belt, guide and the like) by that of a bearing, a gear, a belt, a guide or the like.

BEST MODE FOR CARRYING OUT THE INVENTION

First Embodiment

Figure 1:
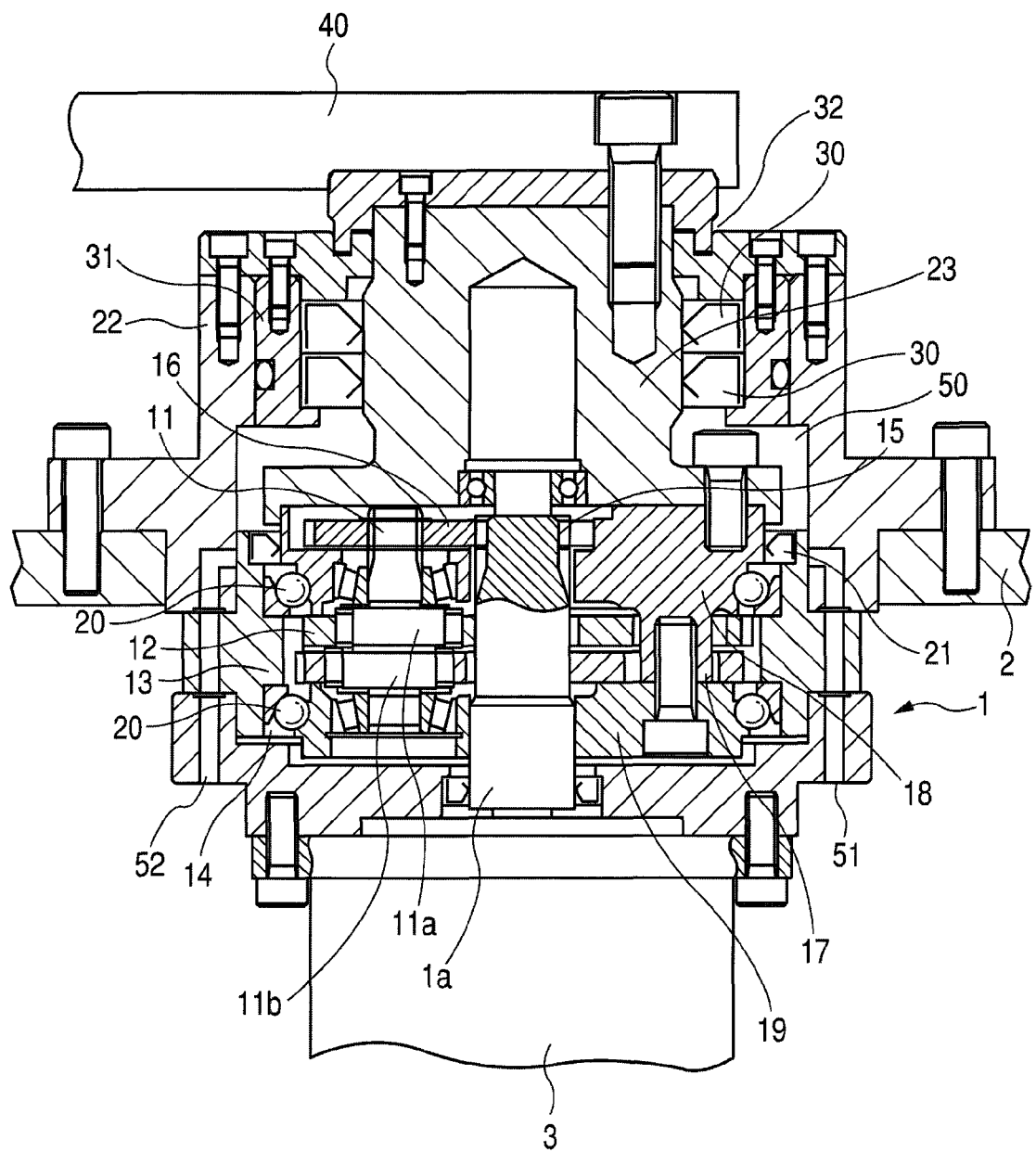
FIG. 1 is a sectional view of a drive portion according to a first embodiment of the invention.

The invention will be explained in details in reference to the drawings illustrating embodiments of the invention as follows. FIG. 1 is a sectional view of a drive portion according to a first embodiment of the invention. A gear apparatus 1 for vacuum used as a drive apparatus of a fabrication apparatus for fabricating a processed object of a semiconductor wafer, a liquid crystal substrate or the like under a vacuum environment is attached to a partition wall 2 of a carrying chamber comprising a vacuum vessel in a hermetically sealed state by seal means of an O-ring or the like.

An input side 1a of the gear apparatus 1 for vacuum is provided with a drive motor 3, and an output rotation of the drive motor 3 is outputted through the gear apparatus 1 for vacuum. According to the invention, the drive motor is placed under an atmospheric environment.

The gear apparatus 1 for vacuum is an eccentric pivoting type gear apparatus for vacuum comprising a cam shaft 11 having crank portions 11a and 11b, two sheets of outer teeth gear members 12 including holes for containing the crank portions 11a and 11b and eccentrically moved by rotation of the cam shaft 11, an inner teeth gear member 13 brought in mesh with outer teeth formed at an outer peripheral face of the outer teeth gear member 12 and formed with inner teeth having a number of teeth slightly larger than a number of teeth of the outer teeth at an inner peripheral face thereof, and a support member 14 disposed at both side ends of the outer teeth gear member 12 for rotatably supporting both ends of the camshaft 11 through rolling bearings, which is arranged on a vacuum environment side under an atmospheric environment.

Output rotation of the drive motor 3 is transmitted to a transmission gear 16 having a number of teeth larger than that of an input gear 15 through the input gear 15 attached to an output rotating shaft of the drive motor 3, and rotates the cam shaft 11 attached to the transmission gear 16 by reducing a speed thereof.

A plurality of pieces (3 pieces in the embodiment) of the cam shafts 11 are arranged equally distributedly at an outer peripheral portion of the input gear 15. The crank portions 11a and 11b are integrally formed with the cam shaft 11 and respectives thereof constitute eccentric phases of 180 degrees. The crank portions 11a and 11b are attached with needle bearings which are inserted to the holes of the outer teeth gear member 12.

An outer periphery of the outer teeth gear member 12 is formed with a peritrochoidal tooth shape which is brought in mesh with pins (inner teeth) held in a plurality of semicircular grooves formed equally distributedly at an inner periphery of the inner teeth gear member 13.

The support member 14 is disposed at inside of the inner teeth gear member 13, the support member 14 includes a column portion 17 loosely fitted to a through hole formed between holes for the cam shaft 11 of the outer teeth gear member 12, and a pair of circular plates 18, 19 at both ends of the column portion 17 for rotatably supporting both ends of the cam shaft 11. Outer peripheries of the pair of circular plates 18, 19 are provided with a pair of main bearings 20 for rotatably supporting the support member 14 relative to the inner teeth gear member 13.

The main bearing 20 is an angular ball bearing for increasing a rigidity thereof by applying a prepressure in being mounted. Further, an oil seal 21 is provided between the inner teeth gear member 13 and the circular plate 18 on one side for sealing a lubricant at inside of the gear apparatus 1 for vacuum.

A housing 22 is integrally coupled with the inner teeth gear member 13 constituting a stationary member. Further, an output transmission shaft 23 is integrally attached to the support member 14 and includes an attaching portion of an arm 40 or the like of a carrying robot operated under a vacuum environment by constituting an output member.

A vacuum seal 30 is provided between the housing 22 and the output transmission shaft 23. The vacuum seal 30 is a contact type vacuum seal including a main lip brought into contact with an outer periphery of the output transmission shaft 23, an elastic member for exerting a contact force to the main lip, and a fitting portion. A contact portion of the output transmission shaft 23 and the main lip is lubricated by a vacuum grease. The vacuum seal 30 is held by a casing 31 at the fitting portion to facilitate maintenance of attaching and detaching the vacuum seal 30. Further, an open end portion of the housing 22 is provided with a labyrinth seal mechanism 32.

As described above, the drive apparatus is provided with the vacuum seal 30 between the stationary member and the output member, further, the oil seal 21 is provided on the atmospheric side of the vacuum seal 30 between the stationary member and the output member. Thereby, a ring-like space 50 is formed by the vacuum seal 30 and the oil seal 21 between the stationary member and the output member.

Further, the stationary member is formed with a supply port 51 of a cooling circulation path from the atmospheric side to the ring-like space 50. Further, the stationary member is formed with a discharge port 52 of the cooling circulation path from the ring-like space 50 to the atmospheric side. Thereby, the vacuum seal 30 and the oil seal 21 are cooled by a cooling fluid supplied from the atmospheric side to the ring-like space 50 through the supply port 51 of the cooling circulation path, and the cooling fluid after cooling is discharged from the ring-like space 50 to the atmospheric side through the discharge port 52 of the cooling circulation path.

In this way, according to the invention, the vacuum seal of the drive apparatus of the robot for carrying the substrate can efficiently be cooled. Thereby, there is provided the drive apparatus of the substrate carrying robot for preventing the vacuum seal from exceeding a heat resistance temperature and preventing a trouble of leaking the atmosphere into the carrying chamber maintained in airtight from being brought about.

Second Embodiment

Figure 2:
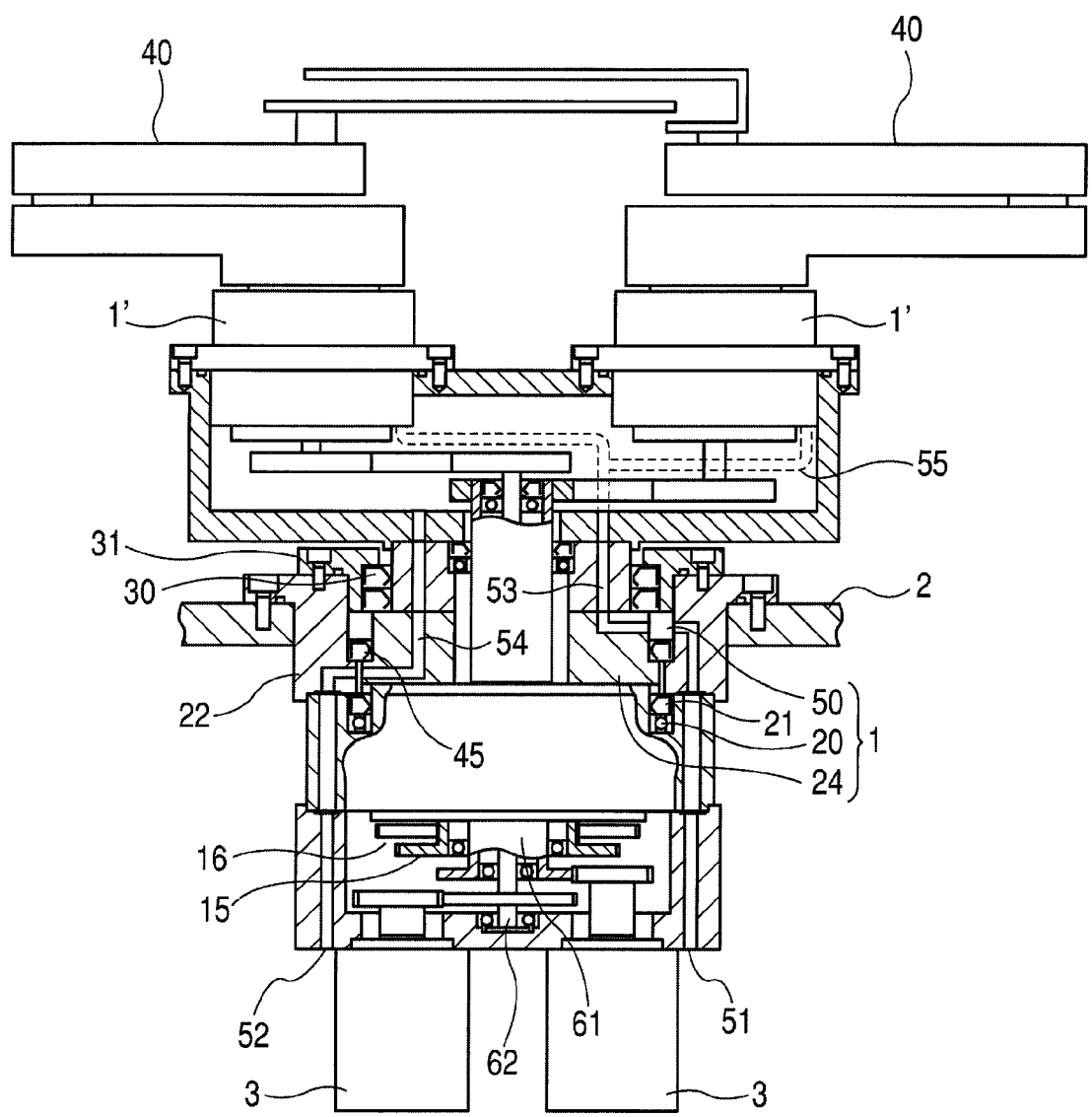
FIG. 2 is a sectional view of a drive portion according to a second embodiment of the invention.

Next, a second embodiment of the invention will be explained in details in reference to FIG. 2 as follows. FIG. 2 is a sectional view of a drive portion of the second embodiment of the invention. The gear apparatus 1 for vacuum used as the drive apparatus of the fabrication apparatus for fabricating a processed object of a semiconductor wafer, a liquid crystal substrate or the like under a vacuum environment is attached to the partition wall 2 of the carrying chamber comprising the vacuum vessel in the hermetically sealed state by the seal means of the O-ring or the like similar to the first embodiment.

An input side of the gear apparatus 1 for vacuum is provided with 3 pieces (1 piece is not illustrated in FIG. 2) of the drive motors 3, 3, and the output rotation of the drive motor 3 is outputted to the arms 40, 40 at inside of the carrying chamber individually through the gear apparatus 1 for vacuum. According to the invention, the drive motors 3, 3 are placed under the atmospheric environment.

The gear apparatus 1 for vacuum of the embodiment is an eccentric pivoting type gear apparatus for vacuum comprising the camshaft 11 having the crank portions 11a and 11b, 2 sheets of the outer teeth gear members 12 including the holes for containing the crank portions 11a and 11b and eccentrically moved by rotation of the cam shaft 11, the inner teeth gear member 13 brought in mesh with the outer teeth formed at the outer peripheral face of the outer teeth gear member 12 and formed with the inner teeth having the number of teeth slightly larger than the number of teeth of the outer teeth at the inner peripheral face, and the support member 14 disposed at both side ends of the outer teeth gear member 12 for rotatably supporting the both ends of the camshaft 11 through the rolling bearings similar to the first embodiment, the support member 14 includes the column portion 17 loosely fitted to the through hole formed between the holes for the cam shaft 11 of the outer teeth gear member 12 and the pair of circular plates 18 and 19 at both ends of the column portion 17, the outer peripheries of the pair of circular plates 18 and 19 are provided with the pair of main bearings 20, the support member 14 is rotatably supported by the inner teeth gear member 13, and in FIG. 2, illustration of details of the inner structure of the gear apparatus 1 for vacuum is omitted. The eccentric pivoting type gear apparatus 1 for vacuum is arranged on the vacuum environment side under the atmospheric environment.

According to the output rotation of the drive motor, similar to the first embodiment, the output rotation of the drive motor 3 is transmitted to the input gear 15, further transmitted to the transmission gear 16, and rotates the cam shaft 11 attached to the transmission gear 16 by reducing the speed similar to the first embodiment.

Although illustration is omitted in FIG. 2, similar to the first embodiment, a plurality of pieces (3 pieces in the embodiment) of the cam shafts 11 are arranged equally distributedly at the outer peripheral portion of the input gear 15. The crank portions 11a and 11b are integrally formed at the cam shaft 11, and the respectives constitute eccentric phases of 180 degrees. The crank portions 11a and 11b are attached with needle bearings which are inserted to the holes of the outer teeth gear member 12.

The main bearing 20 is an angular ball bearing and the rigidity is increased by applying a prepressure in mounting. Further, the oil seal 21 is provided between the inner teeth gear member 13 and the circular plate 18 on one side to seal the lubricant at inside of the gear apparatus 1 for vacuum.

The housing 22 is integrally coupled with the inner teeth gear member 13 to constitute the stationary member. Further, the output transmission shaft 23 is attached integrally with the support member 14 through an adaptor 24 and includes the attaching portion of the arm 40 or the like of the carrying robot operated under the vacuum environment by constituting the output member.

The vacuum seal 30 is provided between the housing 22 and the output transmission shaft 23. The vacuum seal 30 is the contact type vacuum seal including the main lip brought into contact with the outer periphery of the output transmission shaft 23, the elastic member for exerting the contact force to the main lip, and the fitting portion. According to the vacuum seal 30, the fitting portion is held by the casing 31 to facilitate maintenance of attaching and detaching the vacuum seal 30.

As described above, the drive apparatus is provided with the vacuum seal 30 between the stationary member and the output member, further, provided with the oil seal 21 on the atmospheric side of the vacuum seal 30 between the stationary member and the output member. There is further provided a seal 45 for dividing the ring-like space 50 formed by the contact type vacuum seal 30 and the oil seal 21 in two divided parts in an axial direction between the stationary member and the output member, and the stationary member is respectively provided with the supply port 51 of the cooling circulation path on the atmospheric side to the ring-like space 50 on the vacuum side divided in two and the discharge port 52 of the cooling circulation path to the atmospheric side from the ring-like space on the atmospheric side divided in two divided parts. Further, the output member is provided with a rotating supply path 53 communicated with the ring-like space on the vacuum side divided in two divided parts and a rotating discharge path 54 communicating with the ring-like space on the atmospheric side divided in two divided parts, and the rotating supply path 53 and the rotating discharge path 54 are communicated to the gear apparatus 1' for vacuum as drive portions of the arm members 40, 40 through a path 55 indicated by a broken line to cool also the arm members 40, 40.

Next, the gear apparatus 1' for vacuum will be explained in details in reference to FIG. 3. Further, a structure of the gear apparatus 1' for vacuum shown in FIG. 3 is similar to the gear apparatus 1 for vacuum shown in FIG. 1, and therefore, parts the same as those of FIG. 1 are attached with the same citation notations and an explanation thereof will be omitted.

A power is transmitted from the two drive motors 3, 3 shown in FIG. 2 to the gear apparatus 1', 1' for vacuum. That is, a center of the gear apparatus 1 for vacuum shown in FIG. 2 is penetrated with a transmission shaft apparatus comprising a combination of a hollow shaft 61 and a solid shaft 62 penetrated through the hollow shaft, the power of the drive motor 3 on a right side is transmitted to the gear apparatus 1' for vacuum on a right side through the hollow shaft 61, on the other hand, the power of the drive motor 3 on a left side is transmitted to the gear apparatus 1' for vacuum on a left side through the solid shaft 62.

Figure 3:
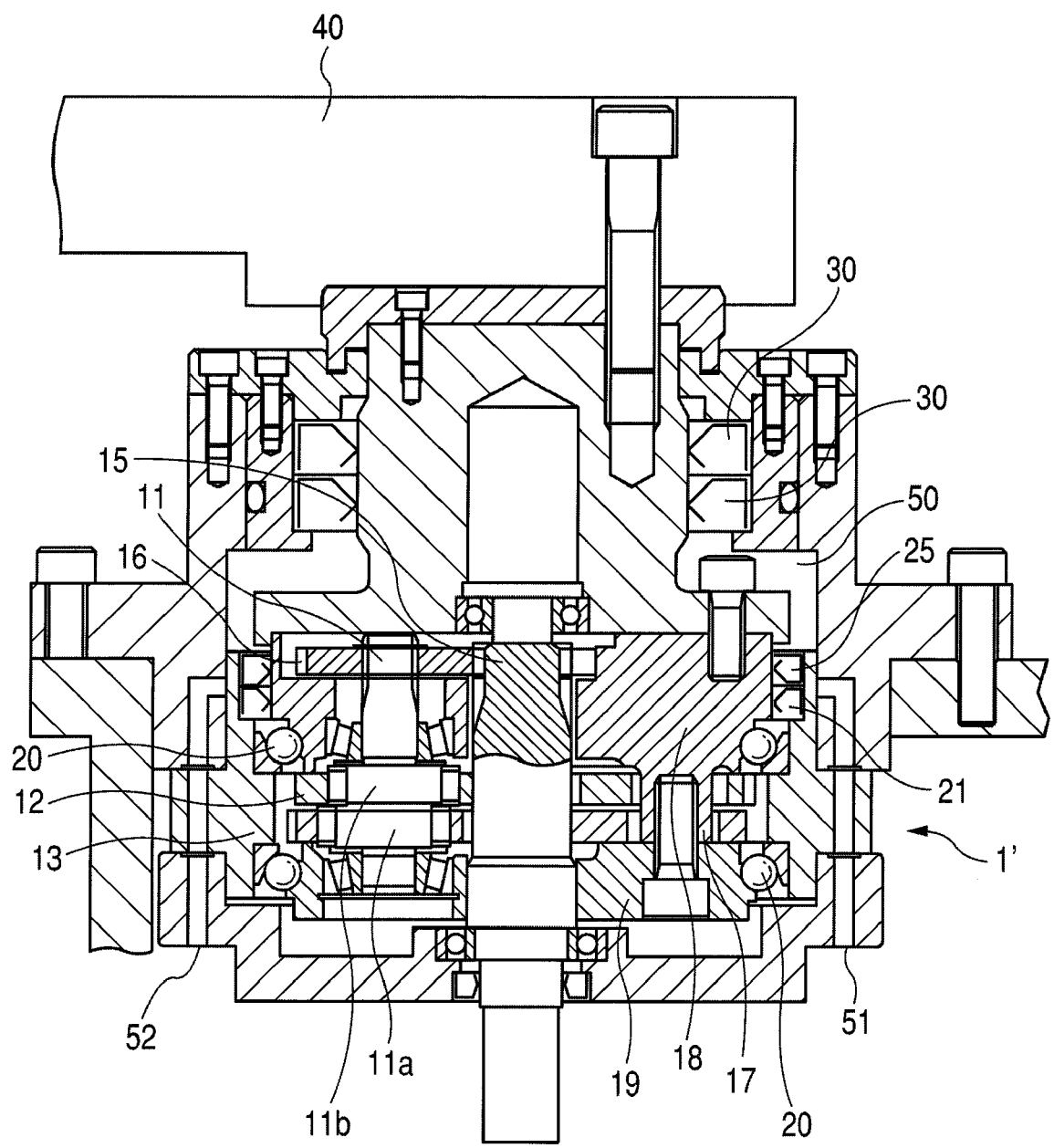
FIG. 3 is a sectional view of a gear apparatus 1' for vacuum used in the second embodiment.

The gear apparatus 1' for vacuum shown in FIG. 3 differs from the gear apparatus 1 for vacuum shown in FIG. 1 in that an oil seal 25 is provided to be opposed to the oil seal 21, and when a pressure of the ring-like space 50 is increased, a cooling fluid is prevented from entering inside of the gear apparatus for vacuum. Further, in the gear apparatus 1 for vacuum shown in FIG. 1, when the pressure of the ring-like space 50 poses a problem, the oil seal 21 can also be constituted by a pressure resistant oil seal.

INDUSTRIAL APPLICABILITY

In this way, according to the invention, cooling of the vacuum seal of the drive apparatus of the robot for carrying the substrate and cooling of the arm member under the vacuum environment can efficiently be carried out. Thereby, there is provided the drive apparatus of the robot for carrying the substrate in which the temperature of the vacuum seal is prevented from exceeding a heat resistance temperature, and the trouble of leaking the atmosphere into the carrying chamber maintained in airtight is not brought about. Further, a reduction in service life of respective parts of bearings, gears, belts, guides and the like by heat can be prevented by cooling the arm member.

The invention claimed is:

1. A drive apparatus of a robot for carrying a substrate in which a group of arms is accommodated under a vacuum environment, comprising:
   a drive apparatus for driving to rotate the group of arms arranged between an atmospheric side and a vacuum side and driven on the atmospheric side such that the drive apparatus is driven on the atmospheric side;
   wherein the drive apparatus includes:
   a vacuum seal provided between a stationary member and an output member; and
   an oil seal provided on the atmospheric side of the vacuum seal between the stationary member and the output member, so that an annular space is formed by the vacuum seal and the oil seal between the stationary member and the output member;
   wherein another seal for dividing the annular space formed by the vacuum seal and the oil seal into two divided parts is provided between the stationary member and the output member, and
   a cooling circulation path is formed such that the stationary member is provided with a supply port of the cooling circulation path from the atmospheric side to the annular space on one of the divided parts and a discharge port of the cooling circulation path to the atmospheric side from the annular space on the other of the divided parts, and
   the output member is provided with a rotating supply path communicated with the annular space on the one of the divided parts and a rotating discharge path communicated with the annular space on the other of the divided parts,
   the rotating supply path and the rotating discharge path are opened to an arm member so as to cool the arm member.

2. The drive apparatus of a robot for carrying a substrate according to claim 1, wherein the one of the divided parts of the annular space is a annular space on the vacuum side, and the other of the divided parts of the annular space is a annular space on the atmospheric side.

3. The drive apparatus of a robot for carrying a substrate according to claim 1, further comprising: a drive motor, an output transmission shaft contained in an inner peripheral side of a housing such that the vacuum seal is brought into contact therewith, and a speed reducer for transmitting an output rotation of the drive motor to the output transmission shaft by reducing a speed thereof, wherein the speed reducer includes an outer teeth gear member, a cam shaft inserted to a hole of the outer teeth gear member, and an inner teeth gear member an inner periphery of which is brought in mesh with an outer periphery of the outer teeth gear member.

4. The drive apparatus of a robot for carrying a substrate according to claim 3, wherein the stationary member is constituted by integrally coupling the housing and the inner teeth gear member, and the output member includes the output transmission shaft.

5. The drive apparatus of a robot for carrying a substrate according to claim 1, wherein the vacuum seal includes a main lip brought into contact with an outer periphery of the output member, an elastic member for exerting a contact force to the main lip, and a fitting portion.

* * * * *